(12) United States Patent
Zhang et al.

(10) Patent No.: US 10,797,241 B1
(45) Date of Patent: Oct. 6, 2020

(54) DISPLAY EQUIPMENT, DISPLAY PANEL, ARRAY SUBSTRATE AND METHOD FOR MANUFACTURING THE SAME

(71) Applicant: BOE TECHNOLOGY GROUP CO., LTD., Beijing (CN)

(72) Inventors: Angran Zhang, Beijing (CN); Can Zhang, Beijing (CN); Can Wang, Beijing (CN); Minghua Xuan, Beijing (CN); Han Yue, Beijing (CN); Ning Cong, Beijing (CN); Jiao Zhao, Beijing (CN); Ming Yang, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/814,101

(22) Filed: Mar. 10, 2020

(30) Foreign Application Priority Data

Sep. 18, 2019 (CN) .......................... 2019 1 0883130

(51) Int. Cl.
*H01L 51/00* (2006.01)
*H01L 51/56* (2006.01)
*H01L 27/32* (2006.01)
*H01L 27/20* (2006.01)

(52) U.S. Cl.
CPC .......... *H01L 51/0013* (2013.01); *H01L 27/20* (2013.01); *H01L 27/3246* (2013.01); *H01L 51/0096* (2013.01); *H01L 51/56* (2013.01)

(58) Field of Classification Search
CPC ....... H01L 51/0096–0097; H01L 51/56; H01L 27/32; H01L 27/3246; H01L 27/3283
See application file for complete search history.

(56) References Cited

U.S. PATENT DOCUMENTS

2019/0094589 A1* 3/2019 Zhu ..................... G02F 1/13394

FOREIGN PATENT DOCUMENTS

| JP | 2014107245 A | * | 6/2014 | |
| KR | 20140140862 A | * | 12/2014 | |
| WO | WO-2019037485 A1 | * | 2/2019 | ............ H01L 27/32 |

* cited by examiner

*Primary Examiner* — Mariceli Santiago
(74) *Attorney, Agent, or Firm* — Calfee, Halter & Griswold LLP

(57) ABSTRACT

The present disclosure relates to an array substrate and a method for manufacturing the same, a display panel, and a display equipment. The array substrate includes a piezoelectric substrate, a pixel defining layer disposed on the piezoelectric substrate and formed with an opening region, and interdigital electrodes disposed oppositely at two sides of the pixel defining layer on the piezoelectric substrate and fitted on the piezoelectric substrate to form an acoustic surface standing wave including an antinodal point and a nodal point. The position of the antinodal point corresponds to the position of the opening region while the position of the nodal point corresponds to the position of the pixel defining layer. In the array substrate provided by the present disclosure, when a light emitting unit is formed in the opening region by a gas jet printing equipment, a gas material can be prevented from diffusing into adjacent opening regions.

14 Claims, 2 Drawing Sheets

DISPLAY EQUIPMENT, DISPLAY PANEL, ARRAY SUBSTRATE AND METHOD FOR MANUFACTURING THE SAME

CROSS REFERENCE

This application is based upon and claims priority to Chinese Patent Application No. 201910883130.7, filed on Sep. 18, 2019, the entire contents thereof are incorporated herein by reference.

TECHNICAL FIELD

The present disclosure relates to the field of display technology, and in particular, to an array substrate and a method for manufacturing the same, a display panel, and a display equipment.

BACKGROUND

OLED (Organic Light-emitting Diode) displays are a new generation of displays. OLED displays have the advantages of good color contrast, active light emission, wide viewing angle, fast response speed, low energy consumption, thinness and lightness, as well as flexibility. The principle of light emission is to prepare an organic thin film between an anode metal and a cathode metal and energize the two electrodes to realize the light emitting of the thin film device.

At present, OLED display devices mainly have two manufacturing processes, one is FMM (Fine metal mask) evaporation process, and the other is JP (Jet printing) process. The JP process can be further divided into liquid ejection and gas ejection according to different printing materials. OVJP (Organic gas jet printing) is to use inert high-temperature gas as a carrier to carry a gaseous luminescent material, and spray it into a pixel definition area of a display device through a micro-jet to condense into a solid film when the gaseous material comes into contact with a cold substrate, so as to finish the film formation of light emitting pattern and realize the preparation of OLED devices.

However, due to the strong diffusibility of the gas material, the film formation in adjacent pixel areas is very likely to occur during the ejection process, which results in device color mixing and device performance degradation.

It should be noted that the information disclosed in the background as above mentioned is only used to enhance the understanding to the background of the present disclosure, and therefore may include information that does not belong to the prior art known to those skilled in the art.

SUMMARY

An object of the present disclosure is to provide an array substrate capable of preventing the luminescent material from diffusing to an adjacent opening region when a gaseous luminescent material is ejected in an opening region, a method for manufacturing the same, a display panel and a display equipment.

According to an aspect of the present disclosure, there is provided an array substrate including:

a piezoelectric substrate;

a pixel defining layer provided on the piezoelectric substrate, an opening region being formed on the pixel defining layer;

interdigital electrodes oppositely disposed on two sides of the pixel defining layer on the piezoelectric substrate, for fitting on the piezoelectric substrate to form an acoustic surface standing wave including an antinodal point and a nodal point, a position of the antinodal point corresponding to a position of the opening region while a position of the nodal point corresponding to a position of the pixel defining layer.

In an exemplary embodiment of the present disclosure, distances between adjacent interdigital fingers of the interdigital electrodes that are disposed oppositely are the same.

In an exemplary embodiment of the present disclosure, distances between the adjacent opening regions in a propagation direction of the acoustic surface standing wave are the same.

In an exemplary embodiment of the present disclosure, the distances between adjacent interdigital fingers of the interdigital electrodes are equal to the distances between the adjacent opening regions in a propagation direction of the acoustic surface standing wave.

In an exemplary embodiment of the present disclosure, extending directions of interdigital fingers of the interdigital electrodes disposed oppositely are parallel.

In an exemplary embodiment of the present disclosure, all the opening regions are arrayed along a first direction and a second direction perpendicular to each other, and the second direction is parallel to the extending directions of the interdigital fingers of the interdigital electrodes.

In an exemplary embodiment of the present disclosure, an orthographic projection of each of the opening regions on the piezoelectric substrate is completely located between orthographic projections of the oppositely disposed interdigital electrodes on the piezoelectric substrate.

According to another aspect of the present disclosure, there is provided a method for manufacturing an array substrate, including:

forming a piezoelectric substrate;

forming oppositely disposed interdigital electrodes on the piezoelectric substrate;

forming a pixel defining layer on the piezoelectric substrate between the oppositely disposed interdigital electrodes, and forming an opening region on the pixel defining layer;

fitting the oppositely disposed interdigital electrodes on the piezoelectric substrate to form an acoustic surface standing wave including an antinodal point and a nodal point, a position of the antinodal point corresponding to a position of the opening region while a position of the nodal point corresponding to a position of the pixel defining layer;

forming a light emitting unit in the opening region by a jet printing equipment.

In an exemplary embodiment of the present disclosure, forming oppositely disposed interdigital electrodes on the piezoelectric substrate includes:

forming an interdigital electrode material layer on the piezoelectric substrate through a film coating process;

forming a photoresist layer on a side of the interdigital electrode material layer away from the piezoelectric substrate;

exposing and developing the photoresist layer to form a photoresist layer with a preset pattern;

etching the interdigital electrode material layer to form the oppositely disposed interdigital electrodes.

In an exemplary embodiment of the present disclosure, forming a light emitting unit in the opening region by a jet printing equipment includes:

mixing a gas luminescent material with a carrier gas by the jet printing equipment to form a mixed gas;

spraying the mixed gas to a target opening region by the jet printing equipment.

In an exemplary embodiment of the present disclosure, the jet printing equipment includes:

an ejector provided with a plurality of nozzles, the nozzle having a diameter smaller than that of the opening region.

In an exemplary embodiment of the present disclosure, the jet printing equipment further includes:

a heating equipment provided on the nozzle for making a temperature of the nozzle higher than a sublimation temperature of a luminescent material forming the light emitting unit.

According to a further aspect of the present disclosure, there is provided a display panel including an array substrate according to any one of above embodiments.

According to a still further aspect of the present disclosure, there is provided a display equipment including a display panel as mentioned above.

The array substrate provided by the present disclosure is provided with interdigital electrodes on both sides of the piezoelectric substrate. When the interdigital electrodes are excited by a radio frequency signal, the interdigital electrodes generate an acoustic surface wave propagating on the piezoelectric substrate, and the acoustic surface waves on both sides meet and superimpose to generate an acoustic surface standing wave. According to the standing wave theory, it is known that the amplitude of the particle at the wave node is smallest, the surrounding medium is compressed, and the pressure is largest; the amplitude of the particle at the wave antinode is largest, the surrounding medium is stretched, and the pressure is smallest. Thus, the sound pressure at the nodal point is stronger than the sound pressure at the antinodal point, so that the pressure on the pixel defining layer region is stronger than that on the opening region. When the gaseous luminescent material is ejected by an organic gas jet printing equipment in the opening region, the gaseous luminescent material will be gathered in the opening region and be difficult to diffuse into non-opening regions or adjacent opening regions, thereby avoiding color mixing of display devices and improving display device performance.

It should be understood that the above general description and the following detailed description are merely exemplary and explanatory, and should not limit the present disclosure.

BRIEF DESCRIPTION OF THE DRAWINGS

The drawings herein are incorporated in and constitute a part of this specification, illustrate embodiments consistent with the present disclosure, and together with the description serve to explain the principles of the present disclosure. Obviously, the drawings in the following description are just some embodiments of the present disclosure. For those skilled in the art, other drawings can be obtained based on these drawings without creative efforts.

Figure 1:
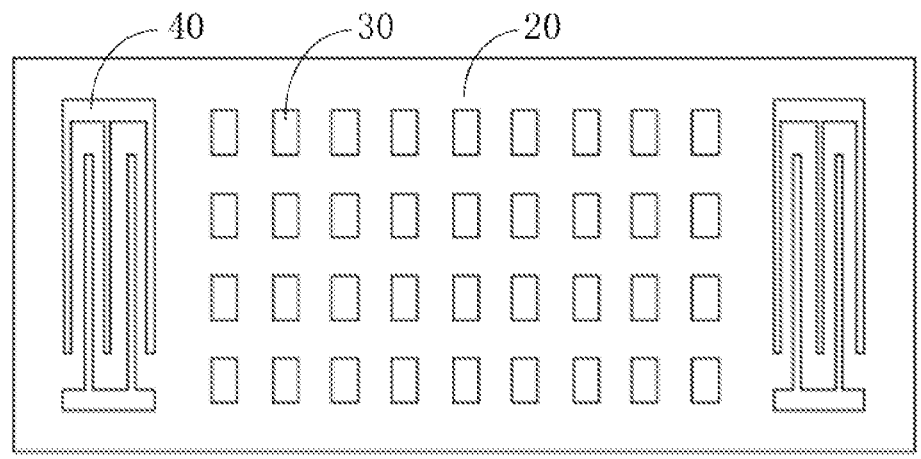
FIG. 1 is a schematic view of an array substrate provided by an embodiment of the present disclosure.

DESCRIPTION OF REFERENCE SIGNS 10 piezoelectric substrate;
20 pixel defining layer;
30 opening region;
40 interdigital electrodes,
410 acoustic surface standing wave,
420 high sound pressure area,
430 low sound pressure area;
50 jet printing equipment,
510 nozzle,
520 ejector,
530 luminescent material storage tank.

DETAILED DESCRIPTION

Embodiments will now be described more fully with reference to the accompanying drawings. However, the example embodiments can be implemented in various forms and should not be construed as limited to the examples set forth herein; rather, the embodiments are provided so that this disclosure will be more comprehensive and complete, and the concepts of the example embodiments will be fully conveyed to those skilled in the art. The described features, structures, or characteristics may be combined in any suitable manner in one or more embodiments.

In the following description, numerous specific details are provided to give a thorough understanding of the embodiments of the present disclosure. However, those skilled in the art will realize that the technical solutions of the present disclosure may be practiced by omitting one or more of the specific details, or other methods, components, equipment, steps, etc. may be adopted. In other cases, well-known technical solutions are not shown or described in detail to avoid obsession and obscure aspects of the present disclosure. In addition, the drawings are merely schematic illustrations of the present disclosure and are not necessarily drawn to scale. The same reference numerals in the drawings represent the same or similar parts, and thus repeated descriptions thereof will be omitted.

The terms "a," "an," "the," and "said" are used to indicate the presence of one or more elements/components/etc.; the terms "include" and "have" are used to include open-ended inclusive means and means that there may be additional elements/components/etc. in addition to the listed elements/components/etc.; the terms "first", "second", etc. are only used as markers, not limitation to the number of their objects.

Figure 2:
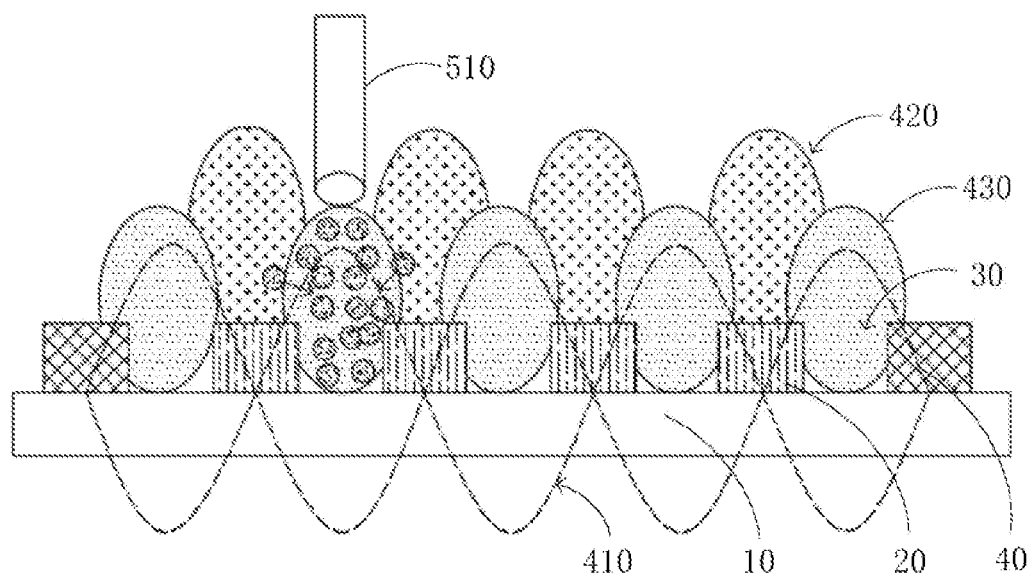
FIG. 2 is a side cross-sectional view of an array substrate provided by an embodiment of the present disclosure.
Figure 3:
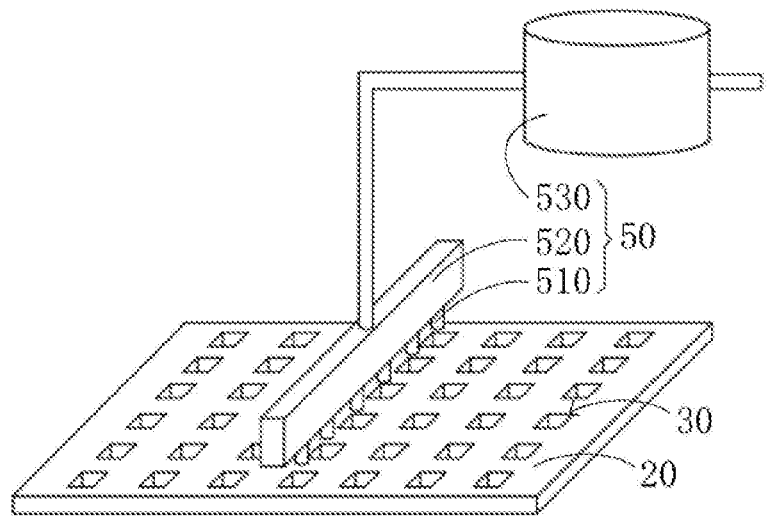
FIG. 3 is a schematic view of a jet printing equipment provided by an embodiment of the present disclosure.

The present disclosure provides an array substrate. As shown in FIGS. 1-3, the array substrate includes a piezoelectric substrate 10, a pixel defining layer 20, and an interdigital electrode 40. The pixel defining layer 20 is disposed on the piezoelectric substrate 10, and the pixel defining layer 20 is formed with an opening region 30. The interdigital electrodes 40 are disposed oppositely at two sides of the pixel defining layer 20 on the piezoelectric substrate 10, and the oppositely disposed interdigital electrodes 40 can be fitted on the piezoelectric substrate 10 to form an acoustic surface standing wave 410 including an antinodal point and a nodal point. A position of the antinodal point corresponds to a position of the opening region 30, while a position of the nodal point corresponds to a position of the pixel defining layer 20.

The array substrate provided by the present disclosure is provided with the interdigital electrodes 40 on both sides of the piezoelectric substrate 10. When the interdigital electrode 40 is excited by a radio frequency signal, the interdigital electrode 40 generates an acoustic surface wave to propagate on the piezoelectric substrate 10. The acoustic surface waves on both sides meet and superimpose to produce an acoustic surface standing wave 410. According to the standing wave theory, the amplitude of the particle at the wave node is smallest, the surrounding medium is compressed, and the pressure is largest; the amplitude of the particle at the wave antinode is largest, the surrounding medium is stretched, and the pressure is smallest. Thus, the sound pressure at the nodal point is stronger than the sound pressure at the antinodal point. A high sound pressure area 420 is formed on the pixel defining layer 20, and a low sound pressure area 430 is formed on the opening region 30, so that the pressure on the area of the pixel defining layer 20 is stronger than that on the opening region. When the gaseous luminescent material is ejected by an organic gas jet printing equipment 50 in the opening region 30, the gaseous luminescent material will be gathered in the opening region 30 and be difficult to diffuse into non-opening regions or adjacent opening regions, thereby avoiding color mixing of display devices and improving display device performance.

The material of the piezoelectric substrate 10 includes at least one of quartz crystal, lithium gallate, lithium germanate, titanium germanate, lithium niobate, lithium tantalate, barium titanate, lead zirconate titanate, lead metaniobate, lead barium lithium niobate, modified lead titanate, and polyvinylidene fluoride. The material of the interdigital electrode 40 includes at least one of copper, gold, silver, aluminum, graphite, platinum, zinc, and lead. The material of the pixel defining layer 20 is an inorganic compound. The inorganic compound may include silicon nitride, silicon oxide, and the like. The thickness of the pixel defining layer 20 may be 0.1 µm to 10 µm.

Specifically, distances between adjacent interdigital fingers of the oppositely disposed interdigital electrodes 40 are the same. With this setting, positions of peaks and troughs of the acoustic waves generated by the oppositely disposed interdigital electrodes 40 can correspond to each other, so that the pressure at the nodal point is maximum and the pressure at the antinodal point is minimum, so that the pressure difference between the antinodal point and the nodal point reaches to a relative maximum value, and the gas luminescent material can be further gathered in the opening region 30 to prevent it from diffusing into non-opening regions or the adjacent opening regions, further avoiding color mixing of the display device and improving the performance of the display device.

Further, distances between adjacent opening regions 30 in a propagation direction of the acoustic surface standing wave 410 are the same. By making the distances between the opening regions 30 in the propagation direction of the acoustic surface standing wave 410 uniform, the antinodal point can be relatively located at the center of the opening region 30, so that the pressure at the opening region 30 can be minimized, which can further ensure the gaseous luminescent material to be gathered in the opening region 30 to prevent it from diffusing into non-opening regions or the adjacent opening regions.

Further, the distances between adjacent interdigital fingers of the interdigital electrodes 40 are equal to the distances between the adjacent opening regions 30 in a propagation direction of the acoustic surface standing wave 410. By setting the distances between adjacent interdigital fingers to be same to the distances between the adjacent opening regions 30 in a propagation direction of the acoustic surface standing wave 410, multiple antinodal points of the acoustic surface standing wave 410 can be located at the central parts of multiple opening regions 30 correspondingly, so that the pressure at each opening region 30 is at a minimum state, which can further ensure the gaseous luminescent material to be gathered in the opening region 30 and prevent it from diffusing into non-opening regions or adjacent opening regions.

Specifically, extending directions of interdigital fingers of the oppositely disposed interdigital electrodes 40 are parallel. By setting the extending directions of interdigital fingers of the oppositely disposed interdigital electrodes 40 to be parallel, it is possible to ensure that the peaks and troughs of the sound waves generated by the oppositely disposed interdigital electrodes 40 corresponds to each other, so that the pressure difference between the antinodal point and the nodal point reaches to a relative maximum value, and the gas luminescent material can be further gathered in the opening region 30 to prevent it from diffusing into non-opening regions or adjacent opening regions, further avoiding color mixing of the display device and improving the performance of the display device.

Further, as shown in FIG. 1, all the opening regions 30 are arrayed along a first direction and a second direction perpendicular to each other, the first direction is perpendicular to the extending directions of the interdigital fingers of the interdigital electrodes 40 and the second direction is parallel to extending directions of the interdigital fingers of the interdigital electrodes 40. With this arrangement, each of the opening regions 30 can be in one-to-one correspondence with each of the multiple antinodal points of the acoustic surface standing wave 410, so that the pressure at each opening region 30 is at a minimum state, which can further ensure the gaseous luminescent material to be gathered in the opening region 30 and prevent it from diffusing into non-opening regions or adjacent opening regions.

Specifically, as shown in FIG. 1, an orthographic projection of each of the opening regions 30 on the piezoelectric substrate 10 is completely located between the orthographic projections of the oppositely disposed interdigital electrodes 40 on the piezoelectric substrate 10, that is, the acoustic surface wave generated by the oppositely disposed interdigital electrodes 40 can completely cover each of the opening regions 30, so that each of the opening regions 30 corresponds to each of the multiple antinodal points of the acoustic surface standing wave 410, so as to ensure the pressure of each opening region 30 to be relatively reduced, which can further make the gaseous luminescent material to be gathered in the opening region 30 and prevent it from diffusing into non-opening regions or adjacent opening regions.

Figure 4:
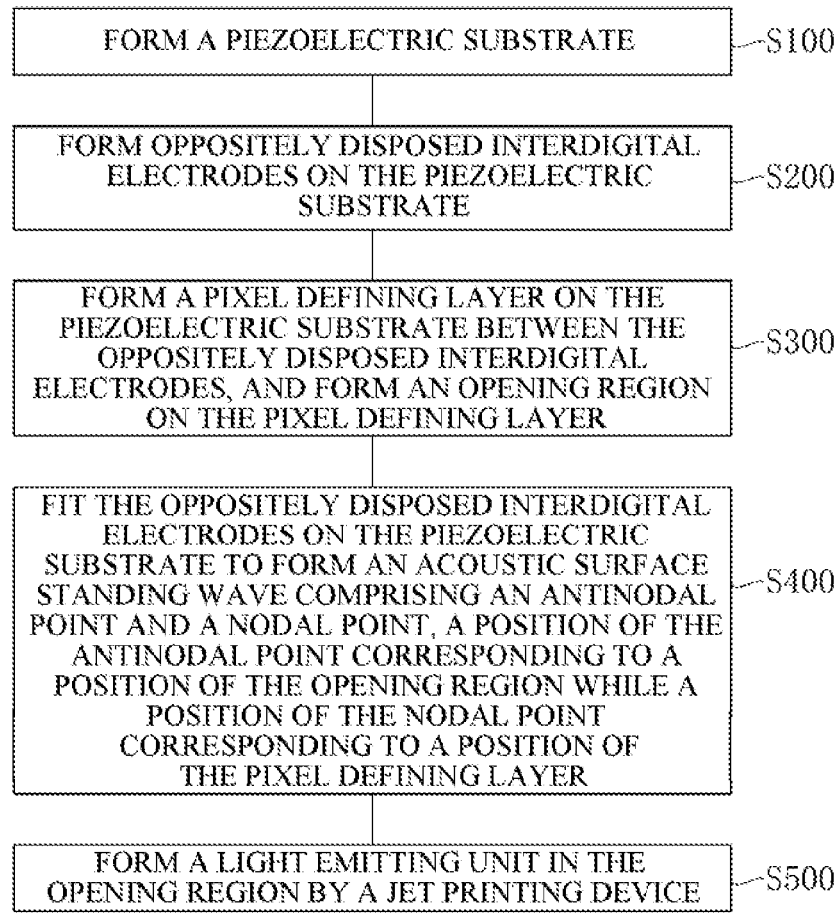
FIG. 4 is a flowchart of a method for manufacturing an array substrate provided by an embodiment of the present disclosure.

The present disclosure also provides another method for manufacturing an array substrate. As shown in FIG. 4, the method includes:

Step S100: forming a piezoelectric substrate;

Step S200: forming oppositely disposed interdigital electrodes on the piezoelectric substrate;

Step S300: forming a pixel defining layer on the piezoelectric substrate between the oppositely disposed interdigital electrodes, and forming an opening region on the pixel defining layer;

Step S400: fitting the oppositely disposed interdigital electrodes on the piezoelectric substrate to form an acoustic surface standing wave including an antinodal point and a nodal point, a position of the antinodal point corresponding to a position of the opening region, while a position of the nodal point corresponding to a position of the pixel defining layer;

Step S500: forming a light emitting unit in the opening region by a jet printing equipment.

In the method for manufacturing the array substrate provided by the present disclosure, oppositely disposed interdigital electrodes are formed on two sides of a piezoelectric substrate. When the interdigital electrode is excited by a radio frequency signal, the interdigital electrode will generate an acoustic surface wave to propagate on the piezoelectric substrate. The acoustic surface waves on both sides meet and superimpose to generate an acoustic surface standing wave. The sound pressure at the nodal point of the acoustic surface standing wave is greater than that at the antinodal point of the acoustic surface standing wave, forming a high sound pressure region on the pixel defining layer and a low sound pressure on the opening region so that the pressure at the pixel defining layer region is stronger than that at the opening region. When the gaseous luminescent material is ejected by an organic gas jet printing equipment in the opening region, the gaseous luminescent material will be gathered in the opening region and be difficult to diffuse into non-opening regions or adjacent opening regions, thereby avoiding color mixing of display devices and improving display device performance.

Hereinafter, each step of the method for manufacturing an array substrate in this exemplary embodiment will be further described.

In step S100, form a piezoelectric substrate.

Specifically, at least one of quartz crystal, lithium gallate, lithium germanate, titanium germanate, lithium niobate, lithium tantalate, barium titanate, lead zirconate titanate, lead metaniobate, lead barium lithium niobate, modified lead titanate, and polyvinylidene fluoride forms the piezoelectric substrate.

In step S200, form the oppositely disposed interdigital electrodes on the piezoelectric substrate, which includes steps S210 to S240.

In step S210, form an interdigital electrode material layer on the piezoelectric substrate by a film coating process.

Specifically, the material of the interdigital electrodes may include at least one of copper, gold, silver, aluminum, graphite, platinum, zinc, and lead.

In step S220, form a photoresist layer on a side of the interdigital electrode material layer away from the piezoelectric substrate.

Specifically, the photoresist layer may be formed of a positive photoresist material or an anisotropic photoresist material.

In step S230, expose and develop the photoresist layer to form a photoresist layer with a predetermined pattern.

Specifically, according to the specific type of the photoresist, the photoresist layer may be exposed and developed to form a target pattern of the oppositely disposed interdigital electrodes.

In step S240, etch the interdigital electrode material layer to form the oppositely disposed interdigital electrodes.

Specifically, after exposing and developing the photoresist layer, a target pattern is formed, and then the interdigital electrode material layer is etched through an etching process, so as to form the oppositely disposed interdigital electrodes, and then remove the photoresist on the interdigital electrodes.

The manufacturing process of the interdigital electrodes is compatible with the manufacturing process of the display device back board, and no additional apparatus is needed, which can relatively reduce the process difficulty and process cost. In addition, the interdigital electrodes can also be formed on the piezoelectric substrate by a sputtering process, which is not limited in the present disclosure.

In step S300, form a pixel defining layer on the piezoelectric substrate between the oppositely disposed interdigital electrodes, and form an opening region on the pixel defining layer.

Specifically, a TFT layer is formed on the piezoelectric substrate between the oppositely disposed interdigital electrodes, after that an anode layer is formed on the TFT layer, and then the pixel defining layer having the opening region is formed on the anode layer.

In step S400, fit the oppositely disposed interdigital electrodes on the piezoelectric substrate to form an acoustic surface standing wave including an antinodal point and a nodal point, the position of the antinodal point corresponding to the position of the opening region, while the position of the nodal point corresponding to the position of the pixel defining layer.

Specifically, when a radio frequency signal is applied to the interdigital electrodes, and the interdigital electrodes are excited by the radio frequency signal, the interdigital electrodes generate acoustic surface waves to propagate on the piezoelectric substrate. The acoustic surface waves on both sides meet and superimpose to generate an acoustic surface standing wave, so that the position of the antinodal point corresponds to the position of the opening region while the position of the nodal point corresponds to the position of the pixel defining layer. Because the sound pressure at the nodal point of the acoustic surface standing wave is greater than that at the antinodal point of the acoustic surface standing wave, the pressure on the pixel defining layer region is stronger than that on the opening region. When the gaseous luminescent material is ejected by the organic gas jet printing equipment in the opening region, the gaseous luminescent material will be gathered in the opening region.

In step S500, form a light emitting unit in the opening region by a jet printing equipment, which includes step S510 and step S520.

In step S510, form a mixed gas by mixing the gaseous luminescent material with a carrier gas by the jet printing equipment.

Specifically, as shown in FIG. 3, the gaseous luminescent material may be stored in a luminescent material storage tank 530, and then the carrier gas is injected into the luminescent material storage tank 530. The carrier gas carries the luminescent material and flows from the luminescent material storage tank 530 so as to form the mixed gas. The carrier gas may be an inert gas such as nitrogen, helium, neon, argon, krypton, xenon, or radon. The luminescent material may be at least one of an OLED phosphorescent material, a fluorescent material, and a TADF material.

In step S520, the mixed gas is sprayed to a target opening region 30 by the jet printing equipment.

Specifically, as shown in FIG. 3, the mixed gas reaches an ejector 520 through a pipeline, and the ejector 520 distributes the mixed gas to each of nozzles 510 so that the mixed gas is sprayed from the nozzles 510 into the opening region 30 at a preset speed so as to form a light emitting layer.

The shape of the nozzle 510 may be a circle, an oval, a triangle, a rectangle, a regular polygon, and the like. The diameter of the nozzle 510 is smaller than the diameter of the opening region 30. That is, the size of the nozzle 510 is smaller than the size of the opening region 30 so as to ensure the gaseous luminescent material to be gathered in the opening region 30 and avoid diffusion to the non-opening regions 30 or adjacent opening regions 30. The luminescent material is gathered in the opening region 30 and desublimates to form a thin film when it meets the cold piezoelectric substrate 10.

Further, the jet printing equipment 50 further includes a heating equipment. The heating equipment is provided on the nozzle 510 for making the temperature of the nozzle 510 higher than the sublimation temperature for forming the luminescent material of the light emitting unit. The heating equipment may be a heating resistor provided on the nozzle 510. When the heating resistor is powered on, the nozzle 510 may be heated by the heat generated by the heating resistor, so that the temperature of the nozzle 510 is higher than the sublimation temperature for forming the luminescent material of the light emitting unit, thereby ensuring that the luminescent material can be completely ejected from the nozzle 510 to avoid condensing on the nozzle 510 and blocking the nozzle 510, for improving the reliability of the jet printing equipment 50.

As shown in FIG. 3, the nozzles are arranged in a row on the ejector 520, and the number of the ejectors 520 is equal to the number of the longitudinal opening regions 30. The number of the ejectors 520 may also equal to the number of the lateral opening regions 30. The jet printing equipment 50 may have one or three (one for each of R/G/B) ejectors 520 or multiple of three ejectors 520 to increase the efficiency of forming the light emitting unit in the opening region 30.

Specifically, the light emitting unit may include a hole injection layer, a hole transport layer, a light emitting layer, an electron transport layer, and an electron injection layer stacked in turn. The hole injection layer, the hole transport layer, the electron transport layer, and the electron injection layer may also be formed in the opening region by the above processes.

Furthermore, although the various steps of the method of the present disclosure are described in a particular order in the drawings, this does not require or imply that the steps must be performed in that particular order or that all of the steps shown must be performed to achieve the desired result. Additionally or alternatively, certain steps may be omitted, multiple steps may be combined into one step for execution, and/or one step may be split into multiple steps for execution, and so on.

The present disclosure also provides a display panel including the above-mentioned array substrate. When the display panel is formed, the gaseous luminescent material will be gathered in the opening region, and is difficult to diffuse into the non-opening regions or the adjacent opening regions so as to avoid color mixing of display devices and improve the performance of the display device. For more beneficial effects, the above description of the beneficial effects of the array substrate may be referred, and will not be repeated here.

The present disclosure also provides a display equipment including the above display panel, which can avoid color mixing of the display equipment and improve the performance of the display equipment. For more beneficial effects, the description of the beneficial effects of the array substrate may be referred, and will not be repeated here. The display equipment may be an equipment with a display panel, such as a mobile phone, a computer, an advertising screen, an electronic watch, an electronic bracelet, or a television etc., which are not listed here.

Those skilled in the art will readily contemplate other embodiments of the present disclosure after considering the specification and practicing the invention disclosed herein. This application is intended to cover any variations, uses, or adaptations of this disclosure that conform to the general principles of this disclosure and includes the common general knowledge or conventional technical means in the technical field not disclosed by this disclosure. It is intended that the specification and examples are considered as exemplary only, with a true scope and spirit of the disclosure being indicated by the attached claims.

What is claimed is:

1. An array substrate, comprising:
   a piezoelectric substrate;
   a pixel defining layer provided on the piezoelectric substrate, an opening region being formed on the pixel defining layer;
   interdigital electrodes oppositely disposed on two sides of the pixel defining layer on the piezoelectric substrate, and fitting on the piezoelectric substrate to form an acoustic surface standing wave comprising an antinodal point and a nodal point, a position of the antinodal point corresponding to a position of the opening region, while a position of the nodal point corresponding to a position of the pixel defining layer.

2. The array substrate according to claim 1, wherein distances between adjacent interdigital fingers of the oppositely disposed interdigital electrodes are the same.

3. The array substrate according to claim 2, wherein distances between the adjacent opening regions in a propagation direction of the acoustic surface standing wave are the same.

4. The array substrate according to claim 3, wherein the distances between adjacent interdigital fingers of the interdigital electrodes are equal to the distances between the adjacent opening regions in a propagation direction of the acoustic surface standing wave.

5. The array substrate according to claim 1, wherein extending directions of interdigital fingers of the oppositely disposed interdigital electrodes are parallel.

6. The array substrate according to claim 5, wherein all the opening regions are arrayed along a first direction and a second direction perpendicular to each other, and the second direction is parallel to the extending directions of the interdigital fingers of the interdigital electrodes.

7. The array substrate according to claim 1, wherein an orthographic projection of each of the opening regions on the piezoelectric substrate is completely located between orthographic projections of the oppositely disposed interdigital electrodes on the piezoelectric substrate.

8. A method for manufacturing an array substrate, comprising:
   forming a piezoelectric substrate;
   forming oppositely disposed interdigital electrodes on the piezoelectric substrate;
   forming a pixel defining layer on the piezoelectric substrate between the oppositely disposed interdigital electrodes, and forming an opening region on the pixel defining layer;
   fitting the oppositely disposed interdigital electrodes on the piezoelectric substrate to form an acoustic surface standing wave including an antinodal point and a nodal point, a position of the antinodal point corresponding to a position of the opening region, while a position of the nodal point corresponding to a position of the pixel defining layer;
   forming a light emitting unit in the opening region by a jet printing equipment.

9. The method according to claim 8, wherein the step of forming oppositely disposed interdigital electrodes on the piezoelectric substrate comprises:

forming an interdigital electrode material layer on the piezoelectric substrate through a film coating process;

forming a photoresist layer on a side of the interdigital electrode material layer away from the piezoelectric substrate;

exposing and developing the photoresist layer to form a photoresist layer with a preset pattern;

etching the interdigital electrode material layer to form the oppositely disposed interdigital electrodes.

10. The method according to claim 8, wherein the step of forming a light emitting unit in the opening region by a jet printing equipment comprises:

mixing a gas luminescent material with a carrier gas by the jet printing equipment to form a mixed gas;

spraying the mixed gas to a target opening region by the jet printing equipment.

11. The method according to claim 8, wherein the jet printing equipment comprises:

a nozzle having a diameter smaller than that of the opening region.

12. The method according to claim 11, wherein the jet printing equipment further comprises:

a heating equipment provided on the nozzle for making a temperature of the nozzle higher than a sublimation temperature of a luminescent material forming the light emitting unit.

13. A display panel, comprising an array substrate according to claim 1.

14. A display equipment, comprising the display panel according to claim 13.

* * * * *